(12) United States Patent
Iijima et al.

(10) Patent No.: US 6,340,841 B2
(45) Date of Patent: *Jan. 22, 2002

(54) BUILD-UP BOARD PACKAGE FOR SEMICONDUCTOR DEVICES

(75) Inventors: Takahiro Iijima; Akio Rokugawa, both of Nagano (JP)

(73) Assignee: Shinko Electric Industries Co., Ltd., Nagano (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/488,087

(22) Filed: Jan. 20, 2000

(30) Foreign Application Priority Data

Jan. 25, 1999 (JP) .............................. 11-015995

(51) Int. Cl.⁷ ............................................. H01L 23/053
(52) U.S. Cl. ...................... 257/700; 257/698; 257/690; 257/678; 257/773
(58) Field of Search ................................ 257/700, 691, 257/738, 735, 780, 701, 704, 773, 774, 759, 760, 698, 678; 438/106

(56) References Cited

U.S. PATENT DOCUMENTS

| 5,473,120 | A | * | 12/1995 | Ito et al. ........................ 174/264 |
| 5,714,801 | A | * | 2/1998 | Yano et al. .................. 257/691 |
| 6,081,026 | A | * | 11/1998 | Wang et al. ................. 257/700 |
| 5,892,273 | A | * | 4/1999 | Iwasaki et al. ............. 257/690 |
| 5,901,050 | A | * | 5/1999 | Imai .......................... 361/820 |

FOREIGN PATENT DOCUMENTS

| JP | A-7-106464 | 4/1995 |
| JP | A-9-18150 | 1/1997 |

* cited by examiner

Primary Examiner—Carl Whitehead, Jr.
Assistant Examiner—Christy Novacek
(74) Attorney, Agent, or Firm—Pennie & Edmonds LLP

(57) ABSTRACT

A package for semiconductor devices, comprising a core board having a front side with a front side base wiring pattern formed thereon and a back side with a back side base wiring pattern formed thereon, the front and back side wiring patterns being electrically connected to each other through a conductor segment penetrating the core board; a front side laminate of upper wiring patterns with intermediate insulating layers intervening therebetween on the front side base wiring pattern, in which each adjacent pair of the upper wiring patterns are electrically connected to each other through a via plated coating on a side wall of viaholes penetrating one of the intermediate insulating layers that intervenes between the adjacent pair and in which an outermost one of the upper wiring patterns is patterned for electrical connection to a semiconductor chip; a back side laminate of insulating layers on the back side base wiring pattern; an external connection wiring pattern including external connection terminals on the back side laminate of insulating layers; wherein the external connection wiring pattern is electrically connected to the back side base wiring pattern through a via penetrating the back side laminate of insulating layers.

9 Claims, 4 Drawing Sheets

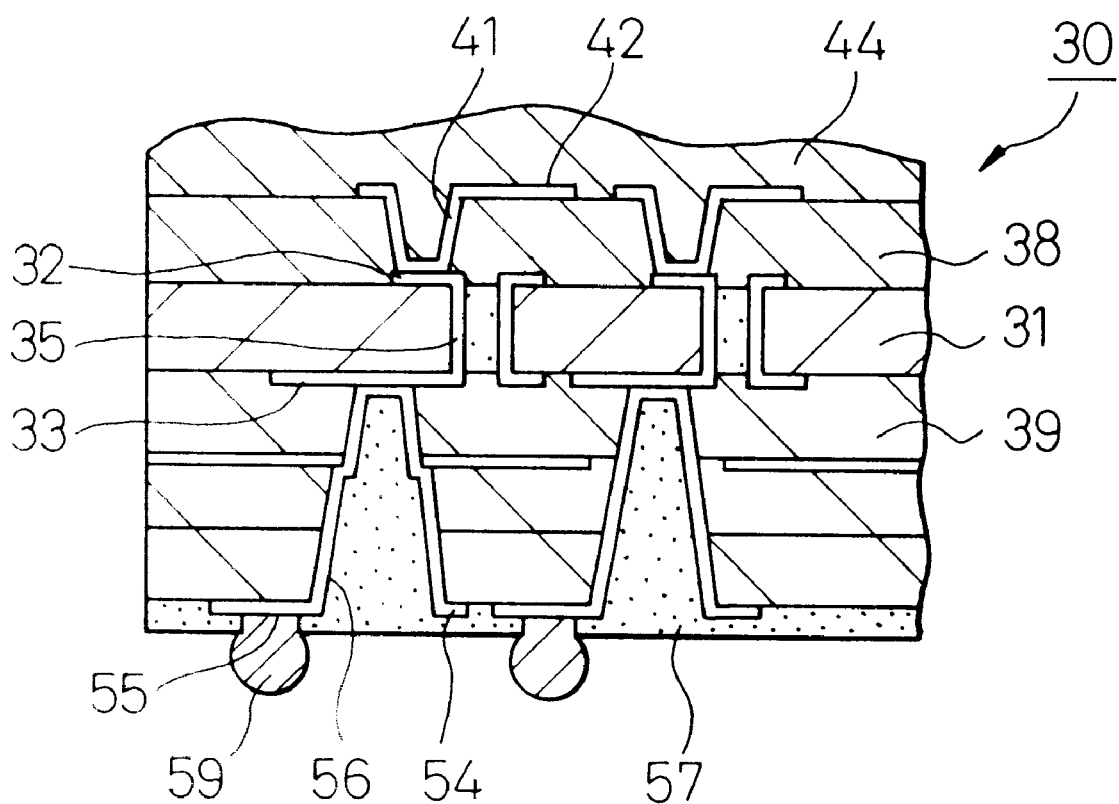

BUILD-UP BOARD PACKAGE FOR SEMICONDUCTOR DEVICES

BACKGROUND OF THE INVENTION

1. Field of the Invention

The present invention relates to a package for semiconductor devices.

2. Description of the Related Art

It is a growing trend to use a package for semiconductor devices in the form of a build-up board composed of a core board having multilayer wiring patterns formed on both sides by build-up process.

FIG. 1 shows a build-up board 10 having a core board 12 of an insulating material having base wiring patterns 13 and 14 formed on both sides and electrically connected to each other by a throughhole plated coating 15.

Insulating layers 16 and 17 are formed on the base wiring patterns 13 and 14, respectively, and contain viaholes 16a and 17a.

Electroless and the subsequent electrolytic plating treatments are conducted to form a copper plated coating on the insulating layers 16 and 17 and the side walls of the viaholes 16a and 17a. The copper plated coating is then patterned by etching to form upper wiring patterns 18 and 19, as a first layer, which are connected to the base wiring patterns 13 and 14 through the copper plated coating of the viaholes 16a and 17a.

The process is repeated to form a multilayer wiring patterns on both sides of the core board 12.

The outermost wiring pattern 20 on the front side of the core board 12 has pads to which a semiconductor chip 21 is bonded by flip-chip bonding.

The outermost wiring pattern 22 on the back side of the core board 12 has external connection terminals on which solder bumps 23 are formed for external connection.

The throughholes and viaholes are filled with a resin and the front and back surfaces are covered with solder resist layers 24, 24 for protection.

The build-up board 10 is advantageous because insulating layers are formed by application of a resin to provide a structure with a small height and the wiring patterns 18, 19, 20 and 22 are formed by plating to allow fine patterning, both enabling mounting of a high density semiconductor chip 21.

However, there is a problem in that the process requires a large number of steps causing an increased cost when forming insulating layers on both sides of a core board 12 by application of a resin or other materials, boring viaholes in each of the insulating layers by laser machining or other methods, plating and etching to form a wiring pattern on each of the insulating layers.

SUMMARY OF THE INVENTION

The object of the present invention is to provide a package for semiconductor devices which can be produced in a reduced number of steps with a reduced cost.

To achieve the object according to the present invention, there is provided a package for semiconductor devices, comprising:

a core board having a front side with a front side base wiring pattern formed thereon and a back side with a back side base wiring pattern formed thereon, the front and back side wiring patterns being electrically connected to each other through a conductor segment penetrating the core board;

a front side laminate of upper wiring patterns with intermediate insulating layers intervening therebetween on the front side base wiring pattern, in which each adjacent pair of the upper wiring patterns are electrically connected to each other through a via plated coating on a side wall of viaholes penetrating one of the intermediate insulating layers that intervenes between the adjacent pair and an outermost one of the upper wiring patterns is patterned for electrical connection to a semiconductor chip;

a back side laminate of insulating layers on the back side base wiring pattern; and an external connection wiring pattern including external connection terminals on the back side laminate of insulating layers, wherein the external connection wiring pattern is electrically connected to the back side base wiring pattern through a via penetrating the back side laminate of insulating layers.

The present inventive structure provides a reduced number of production steps and a reduced production cost because there are no wiring patterns within the back side laminate of insulating layers, except for optional power or ground planes.

It is advantageous if the intermediate insulating layers on the front side of the core board and the insulating layers of the back side laminate are in the same number to provide similar structures on both sides of the core board, thereby preventing distortion of the core board or a completed package.

The via penetrating the back side laminate of insulating layers may be either formed of a plated coating on a side wall of viaholes penetrating the back side laminate of insulating layers, or formed of a conductor segment filling the viaholes.

The package may include bumps formed on the external connection terminals.

The package may optionally include a power plane or a ground plane which intervenes between the insulating layers of the back side laminate and is electrically connected to the via penetrating the back side laminate.

BRIEF DESCRIPTION OF THE DRAWINGS

FIGS. 4A to 4C show process steps of producing another preferred embodiment of the package structure according to the present invention, in cross-sectional views.

DESCRIPTION OF THE PREFERRED EMBODIMENTS

Example 1

Figure 1:
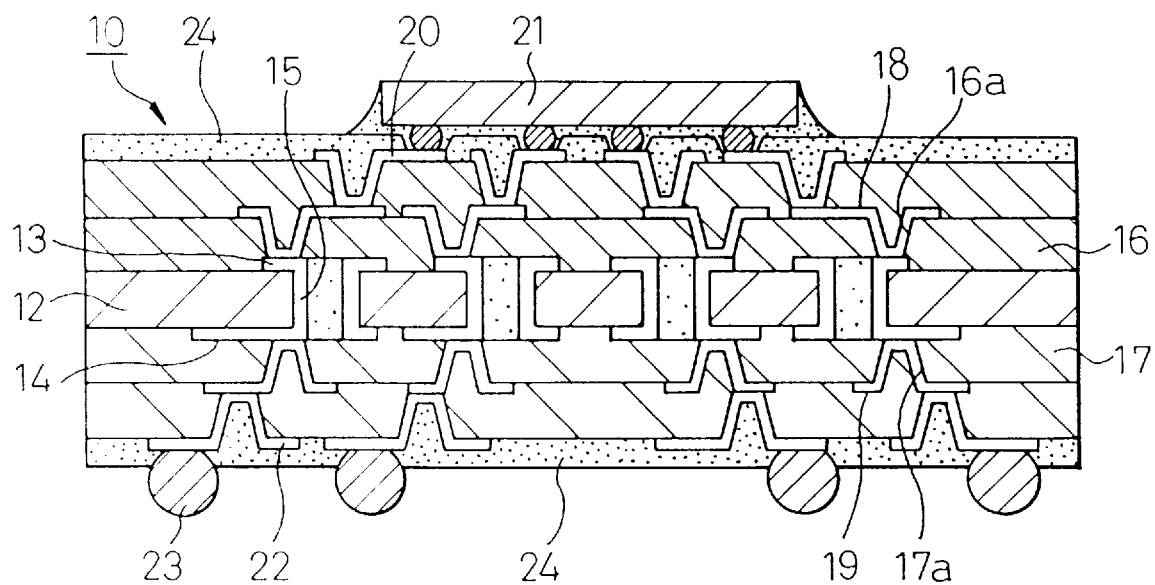
FIG. 1 shows a conventional package structure for semiconductor device, in a cross-sectional view.
Figure 2:
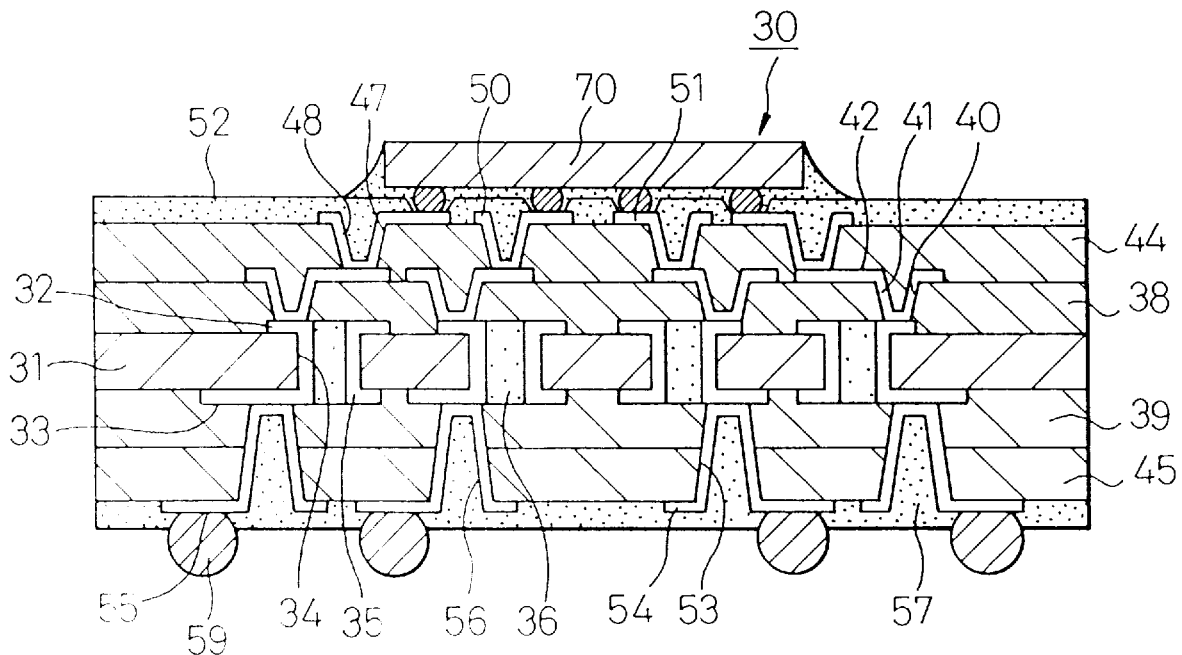
FIG. 2 shows a preferred embodiment of the package structure for semiconductor devices according to the present invention, in a cross-sectional view.

FIG. 2 schematically illustrates a cross section of a preferred embodiment of the package for semiconductor devices according to the present invention.

A package 30 for semiconductor devices includes a core board 31 of an insulating material having base wiring patterns 32 and 33 on both sides, respectively, which are formed by drilling a double-sided copper-clad board to open throughholes 34, electroless- and electrolytic-copper plating the board to form a copper plated coating or conductor segment 35 on the side wall of the throughholes 34, and then etching the copper cladding to form a desired base wiring patterns 32 and 33 on both sides of the board 31. The throughholes 34 are filled with a filler resin 36.

The base wiring patterns may be of any metal other than copper.

The conductor segment 35 may not be composed of a plated coating but may be composed of a conducting material filling the throughholes 34.

A front side insulating layer 38 and a back side insulating layer 39 are then formed by applying polyimide or other resin in the form of liquid or a resin sheet onto the base wiring pattern 32 on the front side of the board 31 and onto the base wiring pattern 33 on the back side of the board 31.

The insulating layer 38 on the front side of the board 31 is then bored by a laser beam to form viaholes 40. At this stage, no viaholes are formed in the insulating layer 39 on the back side of the board 31.

Electroless and the subsequent electrolytic copper plating treatments are conducted to form a copper plated coating on the insulating layer 38 and on the side wall of the viaholes 40.

The copper plated coating is then patterned by etching to form the first upper wiring pattern 42, which is electrically connected to the front side base wiring pattern 32 through a via plated coating 41 on the side wall of the viaholes 40.

The same process is repeated to form a front side insulating layer 44 and a back side insulating layer 45 on the upper wiring pattern 42 and on the back side insulating layer 39, respectively, followed by forming viaholes 47 in the front side insulating layer 44 and forming the second upper wiring pattern 50 electrically connected to the first upper wiring pattern 42 through a via plated coating 48 formed on the side wall of the viaholes 47.

This produces a front side laminate of upper wiring patterns 42 and 50 with intervening front side insulating layers 38 and 44 therebetween on the back side of the core board 31, and on the back side of the core board, a back side laminate of the back side insulating layers 39 and 45.

The multilayer wiring patterns including the front side laminate and the base wiring pattern 32 provide leads from terminals of a semiconductor chip 70 mounted on the package 30.

The insulating layers 39 and 45 on the back side of the core board 31 are bored by a laser beam to form viaholes 53 penetrating the insulating layers 39 and 45 so that portions of the back side base wiring pattern 33 are exposed. The viaholes 53 having a relatively large depth can be bored by laser beam machining.

Electroless and subsequent electrolytic copper plating treatments are conducted to form a copper plated coating on the outermost back side insulating layer 45 and on the side wall of the viaholes 53. The copper plated coating is then patterned by etching to an external connection wiring pattern 54, which is electrically connected to the back side base wiring pattern 33 on the back side of the core board 31 through the via plated coating 56, which is part of the copper plated coating.

A solder resist layer 57 is formed on the outermost back side wiring pattern 54, and then, is bored by photolithography to define external connection terminals 55, which are part the wiring pattern 54.

Thus, a package 30 for semiconductor devices is completed.

The package 30 may further include solder balls or other bumps 59 for external connection.

The wiring patterns on the front side of the core board 31 are sufficiently dense and fine to provide leads from a semiconductor chip so that extremely densely and finely disposed terminals of a semiconductor chip are electrically connected to far more sparsely disposed terminals of the base wiring pattern 32 step by step through a plurality of the front side wring patterns.

Thus, the package structure of the present invention only requires formation of multiple wiring patterns on the front side of the core board and, on the back side, does not require formation of wiring patterns except for an optional power or ground plane to enable reduction in the number of process steps and the production cost.

Figure 3A:
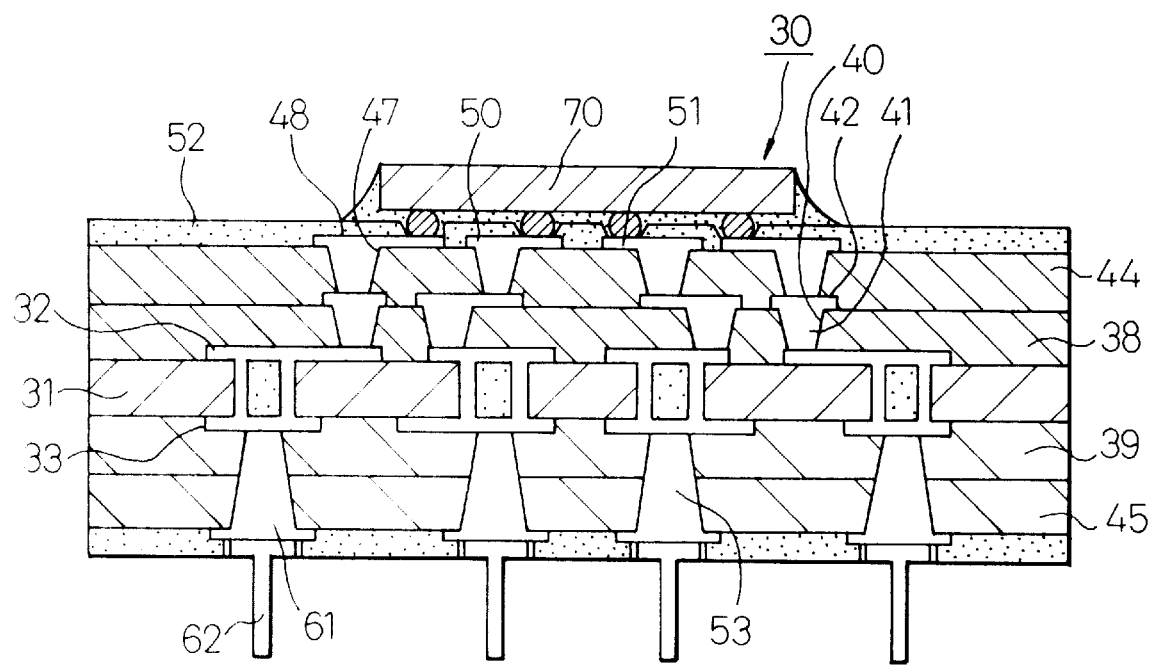
FIGS. 3A and 3B show a modified embodiment of the package structure according to the present invention, in a cross-sectional view and an enlarged cross-sectional view, respectively.
Figure 3B:
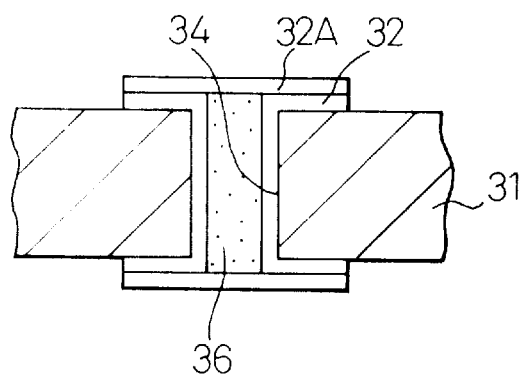

FIGS. 3A and 3B show a modified preferred embodiment of the package structure of the present invention, in which throughholes 34 of a core board 31 are closed on both ends with a plated metal 32A formed on a filler resin 36 and on a portion of a base wiring pattern 32 surrounding the throughholes 34 and in which viaholes 53 are filled with a plated copper or other metal to form vias 61 instead of having the copper plated coating 56 shown in FIG. 2.

This embodiment is advantageous because vias can be formed on vias and external connection terminals such as pins 62 can be also formed on vias to provide a package with a further improved wiring density and a reduced electrical resistivity of vias.

Example 2

Another preferred embodiment of the package structure of the present invention will be described with reference to FIGS. 4A to 4C, in which the corresponding parts are denoted by the same symbols as used in FIG. 2.

Figure 4A:
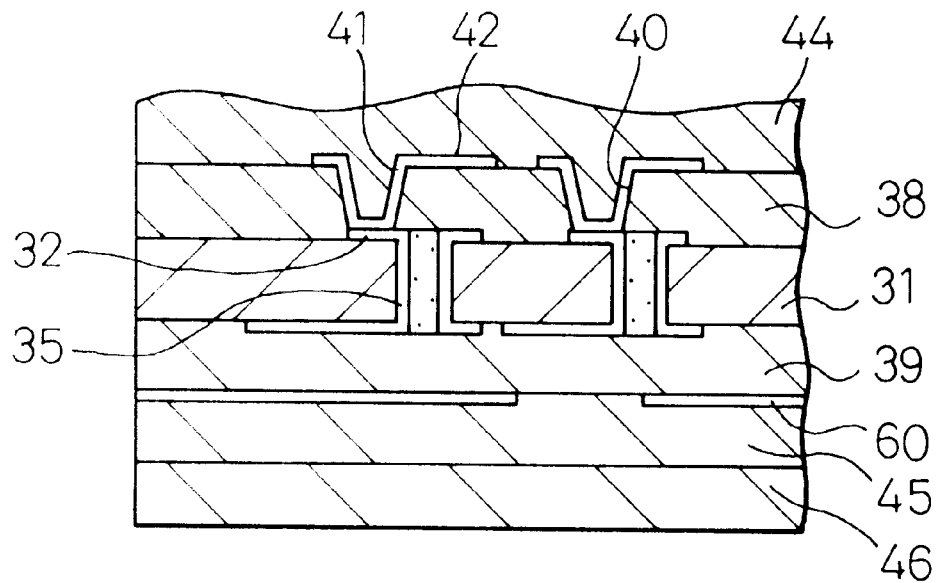

As shown in FIG. 4A, insulating layers 38 and 39 are formed on a core board 31 and viaholes 40 are bored through the insulating layer 38. At this stage, no viaholes are formed in the insulating layer 39.

Electroless and the subsequent electrolytic copper plating treatments are conducted to form a copper plated coating on the insulating layer 38, the side wall of the viaholes 40 and the insulating layer 39.

The copper plated coatings on the insulating layers 38 and 39 are patterned by etching to form a wiring pattern 42 and a flat conductor layer 60.

A laminate of upper wiring patterns with intervening insulating layers is formed on the front side of the board 31.

Insulating layers 45 and 46 are formed on the flat copper plated coating 60 on the back side of the board 31.

Figure 4B:
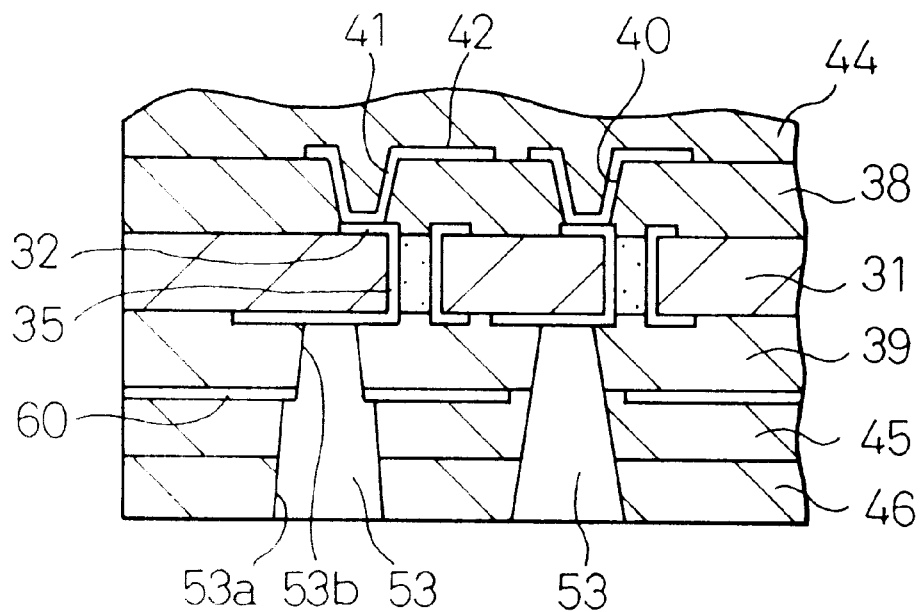

Referring to FIG. 4B, the insulating layers 39, 45 and 46 on the back side of the board 31 are bored by a laser beam to form viaholes 53 penetrating these insulating layers through. This is advantageously effected in such a manner that viaholes 53 are first bored through the insulating layers 45 and 46, and then, the laser beam is further focused to bore the flat copper layer 60 to form viaholes with a reduced diameter, followed by boring the insulating layer 39 to form viaholes 53b with a diameter a little smaller than that of the viaholes 53a. Namely, boring of the copper layer 60 is effected by a laser beam having an energy a little higher than that of the laser beam used to bore the insulating layers 39, 45 and 46.

Boring of the viaholes 53 having a large depth can be carried out by laser beam machining as described above.

Referring to FIG. 4C, electroless and the subsequent electrolytic copper plating treatments are conducted to form a copper plated coating on the outermost insulating layer 46 and on the side wall of the viaholes 53 and the copper plated coating is then patterned by etching to form an outermost wiring pattern 54 having external connection terminals 55 and electrically connected to the back side base wiring pattern 33 on the back side of the core board 31 through a via 56, which is part of the copper plated coating.

A solder resist layer 57 is formed on the outermost wiring pattern 54 and, then, is bored by photolithography to expose the external connection terminals 55.

Thus, a package 30 for semiconductor devices is completed.

The package 30 may further include solder balls or other bumps 59 on the external connection terminals 55.

In this embodiment, the copper layer 60 can serve as a power plane or a ground plane.

As shown in FIG. 4C, the via 56 is stepped in the intermediate portion in which the copper layer 60 is partially exposed to provide an area to ensure secure bonding between the via 56 and a power plane or a ground plane formed by the copper layer 60.

A power plane or a ground plane may be formed on any insulating layer other than the outermost insulating layer 46.

This embodiment is advantageous because the package structure of the present invention only requires formation of multiple wiring patterns on the front side of the core board and, on the back side, does not require formation of wiring patterns except for the power or ground plane to enable reduction in the number of process steps and the production cost.

In either of Examples 1 and 2, insulating layers are preferably formed in the same number on both sides of the core board 31 to prevent undesired distortion of a package.

It will be readily recognized by a person skilled in the art that the present invention is not limited to the embodiments described herein but includes various modifications within the spirit of the present invention.

What is claimed is:

1. A package for semiconductor devices, comprising:
a core board having a front side with a front side base wiring pattern formed thereon and a back side with a back side base wiring pattern formed thereon, the front and back side wiring patterns being electrically connected to each other through a throughhole penetrating the core board;
a front side laminate of upper wiring patterns with intermediate insulating layers intervening therebetween on the front side base wiring pattern, in which each adjacent pair of the upper wiring patterns are electrically connected to each other through a via plated coating on a side wall of viaholes penetrating one of the intermediate insulating layers that intervenes between the adjacent pair and in which an outermost one of the upper wiring patterns has a pad for electrical connection to a semiconductor chip, wherein the pad is electrically connected, through the front side laminate of upper wiring patterns alone, to the throughhole of the core board;
a back side laminate of insulating layers on the back side base wiring pattern; and
an external connection wiring pattern including external connection terminals on the outermost one of the insulating layers of the back side laminate, wherein the external connection wiring pattern is electrically connected to the back side base wiring pattern through a via penetrating the back side laminate of insulating layers and the back side laminate of insulating layers includes no intermediate wiring patterns, except for ground or power planes, intervening between the insulating layers.

2. A package according to claim 1, wherein the via penetrating the back side laminate of insulating layers is either formed of a plated coating on a side wall of viaholes penetrating the back side laminate of insulating layers, or is formed of a conductor segment filling the viaholes.

3. A package according to claim 1, wherein the number of the intermediate insulating layers on the front side of the core board equals the number of the insulating layers of the back side laminate.

4. A package according to claim 1, wherein the external connection terminals of the external connection wiring pattern have bumps or pins formed thereon.

5. A package according to claim 1, further comprising a power plane intervening between the insulating layers of the back side laminate and electrically connected to the via penetrating the back side laminate.

6. A package according to claim 1, wherein the throughhole is closed on both ends with a metal layer connected to the via penetrating the back side laminate of insulating layers.

7. A package according to claim 1, wherein the via of the back side laminate is stepped in the intermediate portion to provide secure bonding between the via and the power plane or the ground plane.

8. A package according to claim 1, wherein each adjacent pair of the upper wiring patterns are electrically connected to each other through a via formed of a plated metal filling the viaholes penetrating one of the intermediate insulating layers that intervenes between the adjacent pair.

9. A package according to claim 1, further comprising a ground plane intervening between the insulating layers of the back side laminate and electrically connected to the via penetrating the back side laminate.

* * * * *